(12) United States Patent
Huang et al.

(10) Patent No.: US 8,362,572 B2
(45) Date of Patent: Jan. 29, 2013

(54) LOWER PARASITIC CAPACITANCE FINFET

(75) Inventors: Chih-Hsiang Huang, Zhubei (TW);
Chia-Pin Lin, Xinpu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 162 days.

(21) Appl. No.: 12/711,690

(22) Filed: Feb. 24, 2010

(65) Prior Publication Data

US 2011/0193175 A1    Aug. 11, 2011

Related U.S. Application Data

(60) Provisional application No. 61/302,611, filed on Feb. 9, 2010.

(51) Int. Cl.
*H01L 29/66* (2006.01)
(52) U.S. Cl. ......... 257/386; 257/308; 257/340; 257/722
(58) Field of Classification Search .................. 257/340, 257/386, 308, 722
See application file for complete search history.

(56) References Cited

U.S. PATENT DOCUMENTS

| | | | | |
|---|---|---|---|---|
| 6,693,335 B2 * | 2/2004 | Gonzalez et al. | ............. | 257/410 |
| 6,706,571 B1 | 3/2004 | Yu et al. | | |
| 6,858,478 B2 | 2/2005 | Chau et al. | | |
| 6,998,676 B2 * | 2/2006 | Kondo et al. | ................. | 257/329 |
| 7,015,078 B1 * | 3/2006 | Xiang et al. | ................. | 438/149 |
| 7,015,547 B2 * | 3/2006 | Hackler et al. | ................. | 257/347 |
| 7,019,342 B2 * | 3/2006 | Hackler et al. | ................. | 257/250 |
| 7,105,897 B2 * | 9/2006 | Chen et al. | ................... | 257/347 |
| 7,190,050 B2 | 3/2007 | King et al. | | |
| 7,247,887 B2 | 7/2007 | King et al. | | |
| 7,265,008 B2 | 9/2007 | King et al. | | |
| 7,402,875 B2 * | 7/2008 | Datta et al. | ..................... | 257/401 |
| 7,411,822 B2 * | 8/2008 | Specht et al. | ............. | 365/185.05 |
| 7,473,964 B2 * | 1/2009 | Izumida | ........................ | 257/336 |
| 7,508,031 B2 | 3/2009 | Liu et al. | | |
| 7,528,465 B2 | 5/2009 | King et al. | | |
| 7,605,449 B2 | 10/2009 | Liu et al. | | |
| 7,656,183 B2 * | 2/2010 | Hsu et al. | ................. | 324/762.08 |
| 7,719,043 B2 * | 5/2010 | Yamagami et al. | ........... | 257/308 |
| 7,777,275 B2 * | 8/2010 | Lee | ............... | 257/347 |
| 7,799,592 B2 * | 9/2010 | Lochtefeld | ...................... | 438/44 |
| 7,906,814 B2 * | 3/2011 | Lee | ................. | 257/365 |
| 7,915,693 B2 * | 3/2011 | Okano | ......................... | 257/401 |
| 2005/0153490 A1 | 7/2005 | Yoon et al. | | |
| 2005/0242395 A1 * | 11/2005 | Chen et al. | ..................... | 257/347 |
| 2005/0272190 A1 * | 12/2005 | Lee et al. | ...................... | 438/176 |
| 2005/0282342 A1 * | 12/2005 | Adan | ............................. | 438/294 |
| 2006/0060941 A1 * | 3/2006 | Sun et al. | ..................... | 257/557 |
| 2006/0091490 A1 * | 5/2006 | Chen et al. | ..................... | 257/458 |
| 2006/0141706 A1 * | 6/2006 | Hong | ............................. | 438/257 |
| 2007/0026615 A1 * | 2/2007 | Goktepeli et al. | ............ | 438/281 |
| 2007/0120156 A1 | 5/2007 | Liu et al. | | |

(Continued)

*Primary Examiner* — Fernando L Toledo
*Assistant Examiner* — Mohammed Shamsuzzaman
(74) *Attorney, Agent, or Firm* — Duane Morris LLP

(57) ABSTRACT

An integrated circuit device includes a gate region extending above a semiconductor substrate and extending in a first longitudinal direction. A first fin has a first sidewall that extends in a second longitudinal direction above the semiconductor substrate such that the first fin intersects the gate region. A second fin has a second sidewall extending in the second direction above the semiconductor substrate such that the second fin intersects the gate region. A shallow trench isolation (STI) region is formed in the semiconductor substrate between the first and second sidewalls of the first and second fins. A conductive layer disposed over the first insulating layer and over top surfaces of the first and second fins. A first insulating layer is disposed between an upper surface of the STI region and a lower surface of the conductive layer to separate the STI region from the conductive layer.

7 Claims, 6 Drawing Sheets

U.S. PATENT DOCUMENTS

| | | | |
|---|---|---|---|
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0210355 A1* | 9/2007 | Izumida | 257/288 |
| 2007/0221992 A1* | 9/2007 | Seliskar | 257/348 |
| 2007/0267695 A1* | 11/2007 | Lee | 257/347 |
| 2008/0029828 A1* | 2/2008 | Oh et al. | 257/401 |
| 2008/0090361 A1* | 4/2008 | Anderson et al. | 438/283 |
| 2008/0233699 A1* | 9/2008 | Booth et al. | 438/283 |
| 2008/0265280 A1* | 10/2008 | Currie | 257/190 |
| 2008/0277729 A1* | 11/2008 | Gossner et al. | 257/360 |
| 2008/0290470 A1 | 11/2008 | King et al. | |
| 2008/0296632 A1 | 12/2008 | Moroz et al. | |
| 2008/0296702 A1 | 12/2008 | Lee et al. | |
| 2009/0181477 A1 | 7/2009 | King et al. | |
| 2009/0184316 A1* | 7/2009 | Hsu et al. | 257/48 |
| 2009/0236595 A1* | 9/2009 | Atanackovic | 257/43 |
| 2009/0321836 A1* | 12/2009 | Wei et al. | 257/365 |
| 2010/0025775 A1* | 2/2010 | Giles et al. | 257/386 |
| 2010/0207209 A1* | 8/2010 | Inokuma | 257/347 |
| 2010/0270619 A1* | 10/2010 | Lee | 257/365 |
| 2010/0308440 A1* | 12/2010 | Johnson et al. | 257/618 |
| 2011/0108930 A1* | 5/2011 | Cheng et al. | 257/412 |
| 2011/0169084 A1* | 7/2011 | Yang et al. | 257/347 |
| 2011/0291196 A1* | 12/2011 | Wei et al. | 257/365 |

* cited by examiner

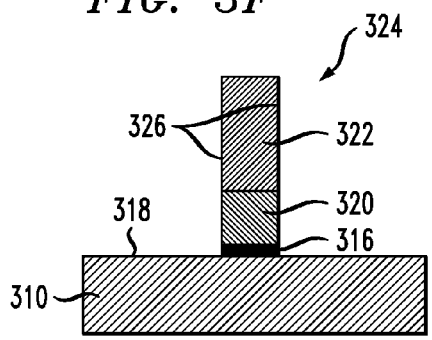
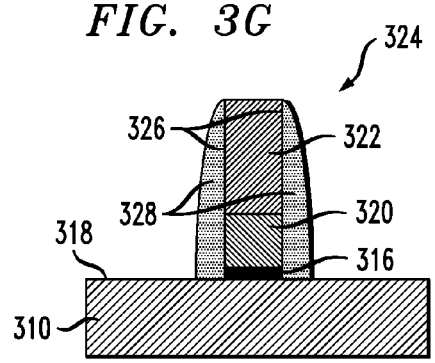
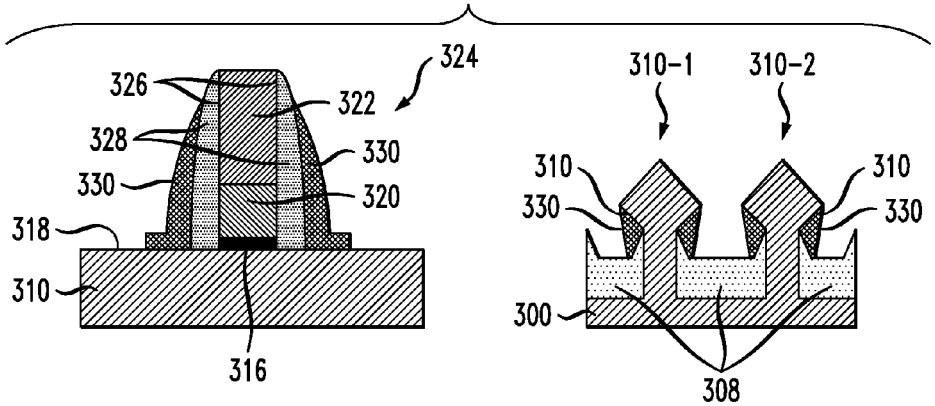
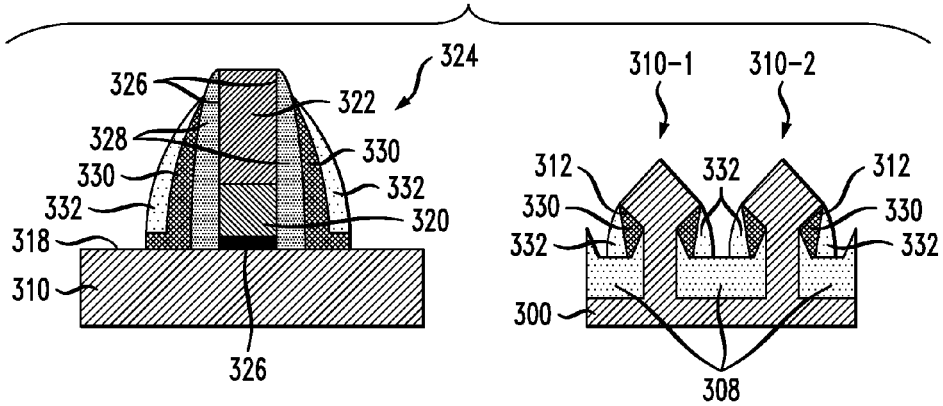

LOWER PARASITIC CAPACITANCE FINFET

CROSS-REFERENCE TO RELATED APPLICATIONS

This application claims priority to U.S. Provisional Patent Application Ser. No. 61/302,611 filed on Feb. 9, 2010, the entirety of which is herein incorporated by reference.

FIELD OF DISCLOSURE

The disclosed system and method relate to integrated circuits. More specifically, the disclosed system and method relate to FinFET transistors having a reduced parasitic capacitance.

BACKGROUND

Fin field effect transistors (FinFETs) are non-planar, multi-gate transistors having "fins" that perpendicularly extend from the gate and form the source and the drain of the transistor. FIG. 1A is a perspective view of a FinFET 100. As shown in FIG. 1A, FinFET 100 includes a vertical silicon fin 104 extending above the substrate 102. Fin 104 is used to form the source and drain 106 regions and a channel therebetween (not shown). A vertical gate 108 intersects the channel region of fin 104. An oxide layer 110 and insulating sidewall spacers 112, 114 are respectively formed on the source and drain regions 106 and the vertical gate 108. The ends of fin 104 are doped to form the source and drain 106 to make fin 104 conductive.

Multiple FinFETs may be coupled to one another to provide an integrated circuit device. A conductive layer may be formed over the fins to provide a local interconnect between adjacent FinFETs. The use of local interconnects enables a higher packing density, which in turn reduces the required chip area for an integrated circuit. However, the formation of the slot contact of the local interconnects increases the parasitic fringe capacitance, which significantly degrades the circuit speed.

Accordingly, an improved FinFET and local interconnect structure are desirable.

SUMMARY

An integrated circuit device is disclosed including a gate region extending above a semiconductor substrate and extending in a first longitudinal direction. A first fin has a first sidewall that extends in a second longitudinal direction above the semiconductor substrate such that the first fin intersects the gate region. A second fin has a second sidewall extending in the second direction above the semiconductor substrate such that the second fin intersects the gate region. A shallow trench isolation (STI) region is formed in the semiconductor substrate between the first and second sidewalls of the first and second fins. A conductive layer disposed over the first insulating layer and over top surfaces of the first and second fins. A first insulating layer is disposed between an upper surface of the STI region and a lower surface of the conductive layer to separate the STI region from the conductive layer.

A method is also disclosed in which a first fin is formed between a first STI region and a second STI region. A second fin is formed between the second STI region and a third STI region. An insulation layer is deposited on an upper surface of the second STI region and at least partially over upper surfaces of the first and second fins. A conductive layer is formed over surfaces of the insulation layer and the first and second fins to provide an interconnect between the first and second fins.

Another semiconductor device is disclosed in which a gate region is disposed above a semiconductor substrate and extending in a first longitudinal direction. A first fin is disposed above the semiconductor substrate and extending in a second longitudinal direction such that the first fin intersects the gate region. The first fin has a first sidewall. A second fin is disposed above the semiconductor substrate and extending in the second longitudinal direction such that the second fin intersects the gate region. The second fin is laterally spaced from the first fin and includes a second sidewall. A first shallow trench isolation (STI) region is formed in the semiconductor substrate between the first and second fins. A first insulating layer is disposed over and contacts an upper surface of the first STI region. The first insulating layer extends from the first sidewall to the second sidewall. A conductive layer is disposed over an upper surface of the insulating layer and on top surfaces of the first and second fins to provide a fin interconnect.

BRIEF DESCRIPTION OF THE DRAWINGS

FIGS. 3A-3M illustrate the gate and fins of improved FinFET devices at various stages of manufacture.

DETAILED DESCRIPTION

Figure 1A:
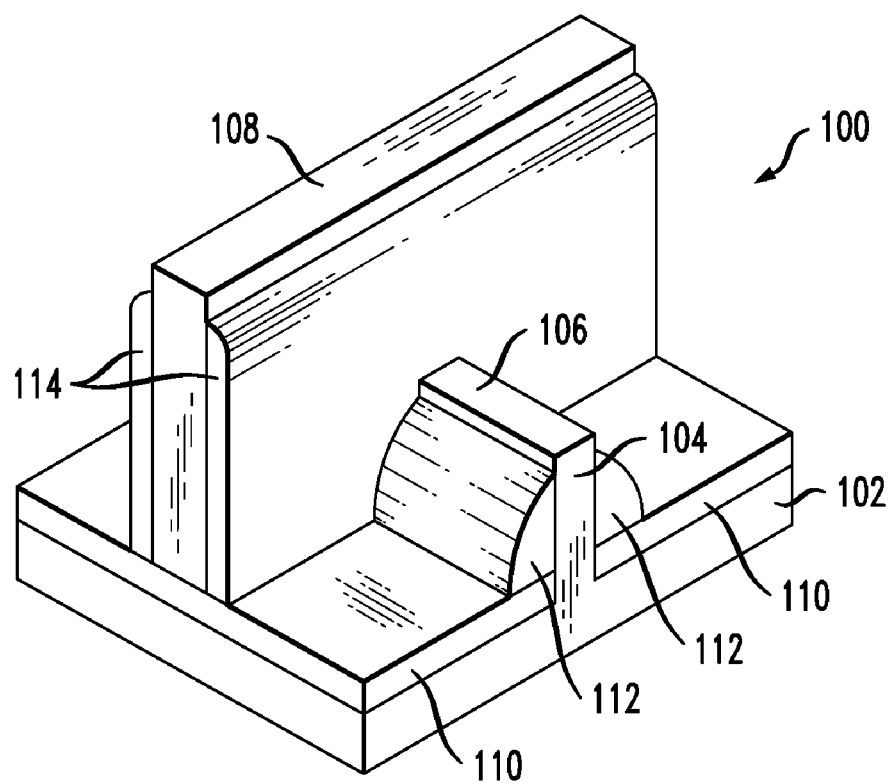
FIG. 1A is an isometric view of a FinFET transistor.
Figure 1B:
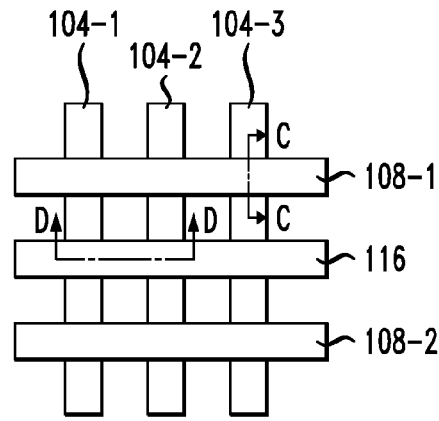
FIG. 1B is a plan view of an array of FinFET devices coupled by a local interconnect.

FIG. 1B illustrates a plan view of a FinFET array in which a plurality of fins 104-1, 104-2, 104-3 are disposed parallel to one another over a semiconductor substrate. Each of the fins 104-1, 104-2, 104-3 intersect a pair of gates 108-1, 108-2, which are also formed over a semiconductor substrate. A local interconnect 116 is formed over each of the fins 104-1, 104-2, 104-3 to conductively connect each of the fins 104-1, 104-2, 104-3.

Figure 1C:
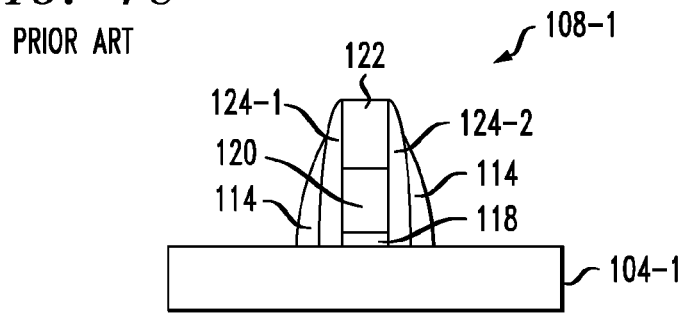
FIG. 1C is a cross-sectional view of a gate of a FinFET device taken along line C-C in FIG. 1B.
Figure 1D:
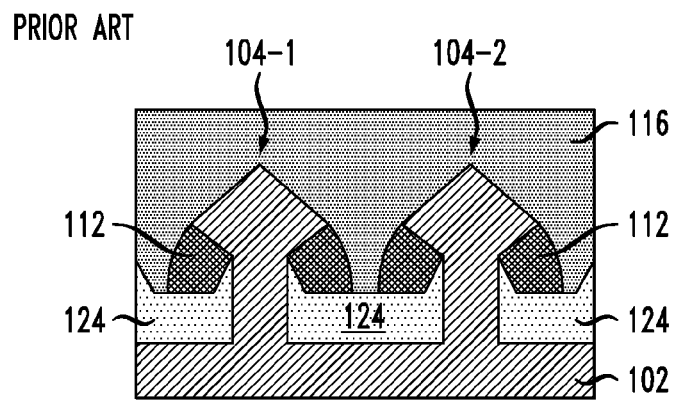
FIG. 1D is a cross-sectional view of adjacent fins of FinFET devices taken along line D-D in FIG. 1B.

FIG. 1C is a cross-sectional view of gate 108-1 taken along line C-C in FIG. 1B, and FIG. 1D is a cross sectional view of fins 104-1, 104-2 taken along line D-D in FIG. 1B. As shown in FIG. 1C, gate 108-1 includes a gate dielectric layer 118 disposed over fin 104-1. Gate electrode layer 120 is disposed over gate dielectric layer 118, and a hard mask layer 122 is formed over the gate electrode layer 120. Sidewall spacers 124-1, 124-2 are formed on the sides of gate dielectric layer, 118, gate electrode layer 120, and hard mask 122, and a second pair of sidewall spacers 114 are disposed over a portion of sidewall spacers 124-1, 124-2.

Turning now to FIG. 1D, fins 104-1, 104-2 are shown with a conductive interconnect layer 116 disposed over the upper surfaces of the fins 104-1, 104-2, sidewall spacers 112, and over an upper surface of a shallow trench isolation (STI) region 124 disposed between the adjacent fins 104-1, 104-2. The slot contact between the STI region 124 and the conductive local interconnect 116 results in a high parasitic capacitance that reduces the operating speed of the FinFET.

An improved FinFET structure and method of making the same includes a layer of oxide, low-k silicon carbide (SiC), carbon-doped silicon oxide (SiO(C)), fluorine-doped silicon oxide, or other low-k material disposed between the sidewalls of adjacent fins is disclosed. The inclusion of the low-k material between fin of the FinFET and the sidewall spacers provides a barrier between the shallow trench isolation (STI) regions and the interconnect, which advantageously reduces the parasitic capacitance and increases the speed of the FinFET.

Figure 2A:
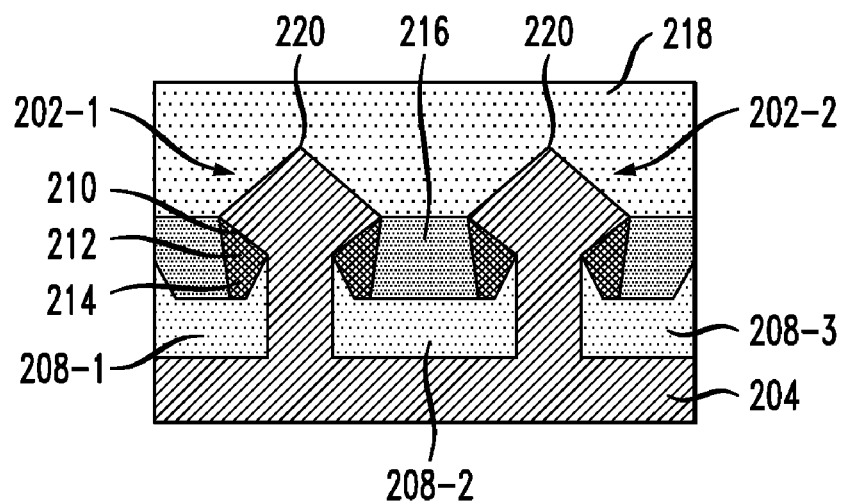
FIG. 2A is a cross-sectional view of a gate of an improved FinFET device.
Figure 2B:
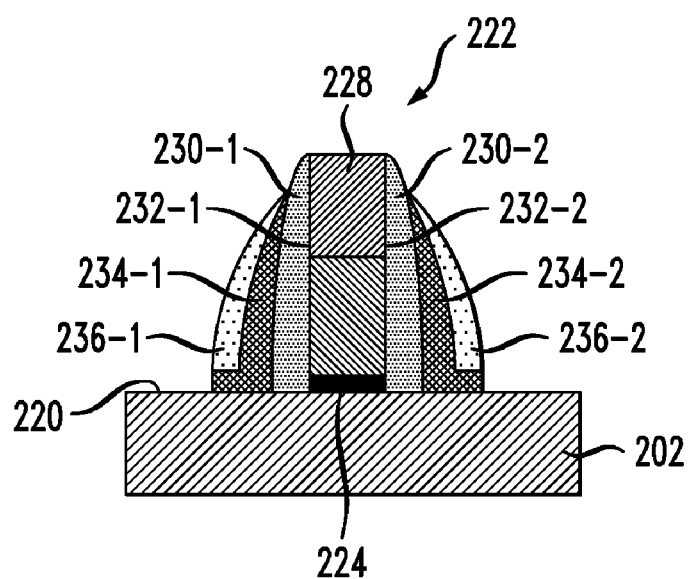
FIG. 2B is a cross-sectional view of a pair of adjacent fins of FinFET devices in accordance with the improved layout described herein.

FIG. 2A is a cross-sectional view of a pair of adjacent fins 202-1, 202-2 (collectively referred to as "fins 202") of an improved FinFET transistor formed above a semiconductor substrate 204, and FIG. 2B is a cross-sectional view of a vertical gate 206 disposed over one of the fins 202. Semiconductor substrate 204 may be bulk silicon, bulk silicon germanium (SiGe), or other Group III-V compound substrate. Referring initially to FIG. 2A, the pair of laterally spaced fins 202 are separated from each other and from other structures by shallow trench isolation (STI) regions 208-1, 208-2, and 208-3 (collectively referred to as "STI regions 208"), which are formed in the semiconductor substrate 204. STI regions 208 may include a dielectric material such as, for example, a high-density plasma (HDP) oxide or a tetraethyl orthosilicate (TEOS) oxide disposed in trenches formed in semiconductor substrate 204 as will be understood by one skilled in the art.

In some embodiments, such as the embodiment illustrated in FIG. 2A, the fin sidewalls 210 may be disposed at an angle with respect to an upper surface of the semiconductor substrate 204 to define an undercut area 212. The undercut area 212 defined by each of the fin sidewalls 210 may be filled with a dielectric insulating layer 214. A second dielectric insulating layer 216 may be disposed over the STI regions 208 between adjacent first insulating layers 214 disposed on the fin sidewalls 210. In some embodiments, a single insulating layer may be disposed over the STI regions 208 and contact adjacent fin sidewalls 210. Examples of materials of the first and second insulating layers 214, 216 include, but are not limited to, silicon carbide (SiC), carbon-doped silicon oxide, fluorine-doped silicon oxide, or other low-k dielectric materials, e.g., dielectric materials having a dielectric constant of approximately less than 3.94, or some combination thereof.

The insulating layer(s) 214, 216 may have a height that is approximately 25-85 percent of the height of the fins 202 as measured from the top of the STI region 208, and more particularly, the height of the insulating layer(s) 214, 216 may be approximately 50-75 percent of the height of the fins 202 as measured from the top of the STI region 208. For example, if the fins have a height of approximately 50 nm measured from the top of the STI region 208, then the insulating layer(s) 214, 216 between adjacent fins 202 may have a height of 30 nm measured from the top of the STI regions 208. A conductive layer 218 such as, for example, tungsten, is disposed over the top surfaces 220 of the fins 202 and the first and second insulating layers 214, 216. Conductive layer 218 is provided as a fin interconnect for conductively coupling together a plurality of fins 202 in the FinFET array.

Turning now to FIG. 2B, the vertical gate 222 of the FinFET is shown disposed above the top surface 220 of one of the fins 202. Gate 222 includes a gate dielectric layer 224 covered by a gate electrode layer 226. Gate dielectric layer 224 may include oxides, nitrides, oxynitrides, high-k dielectrics including, but not limited to, $Ta_2O_5$, $Al_2O_3$, HfO, $SiTiO_3$, HfSiO, HfSiON, ZrSiON, and combinations thereof. Examples of gate electrode layer 226 include, but are not limited to, polysilicon, Ni, Ti, Ta, Hf, metal silicides such as NiSi, MoSi, and HfSi, and metal nitrides such as TiN, TaN, HfN, HFAlN, MoN, and NiAlN, to name a few. A hard mask 228 is formed over the gate electrode layer 226. Materials for hard mask 228 include, but are not limited to a nitride or an oxynitride. Sidewall spacers 230-1, 230-2 are formed over the respective sidewalls 230-1, 230-2 of gate 222. Insulating sidewall layer 234-1, 234-2 is disposed over the sidewall spacers 230-1, 230-2, and a second sidewall spacer layer 236-1, 236-2 is disposed over the insulating sidewall layer 234-1, 234-2. Insulating sidewall layer 234-1, 234-2 may be the same materials insulating layer as insulating layers 214, 216 illustrated in FIG. 2A. The one or more insulating layers 214, 216 disposed between the conductive layer 218 and the STI regions 208 advantageously reduces the parasitic capacitances of the FinFETs, which in turn provides for FinFETs having faster operating speeds through a higher driving current.

Figure 3A:
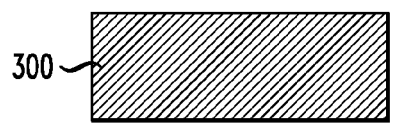

The fabrication of a FinFET array is described with reference to FIGS. 3A-3M. FIG. 3A shows a cross-sectional view of a semiconductor substrate 300, which may be a bulk silicon substrate, a bulk silicon-germanium substrate, or another Group III-V compound substrate. Substrate 300 is patterned and etched through a photolithographic process to provide trenches 302 as shown in FIG. 3B. In some embodiments, the trenches 302 may have a width of approximately 60 nm and a depth of approximately 2200 Angstroms, although one skilled in the art will understand that trenches 302 may have other dimensions. A dielectric layer 304, such as, for example, a high-density plasma (HDP) oxide or a tetraethyl orthosilicate (TEOS) oxide, is formed in the trenches and over the semiconductor substrate as shown in FIG. 3C.

Figure 3D:
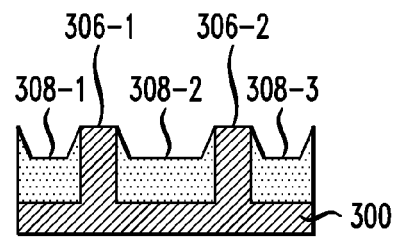
Figure 3B:
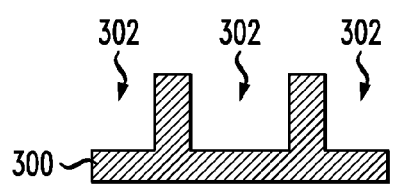
Figure 3E:
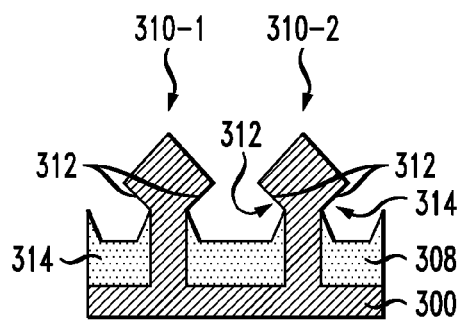
Figure 3C:
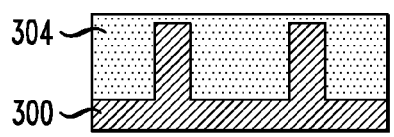
Figure 3J:
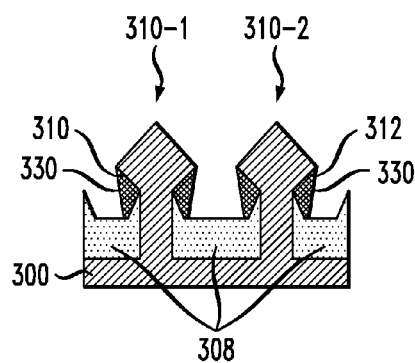

The dielectric layer 304 is planarized until top surfaces 306-1, 306-2 of substrate 300 are exposed and STI regions 308-1, 308-2, and 308-3 (collectively "STI regions 308") are formed as shown in FIG. 3D. The planarization may be a chemical-mechanical planarization (CMP) process as will be understood by one skilled in the art. Fins 310-1, 310-2 (collectively referred to as "fins 310"), which are shown in FIG. 3E, may be formed through an epitaxial growth process as will be understood by one skilled in the art. For example, the epitaxial growth process may be performed until the fins extend to a height of a approximately 50 nm as measured from a top surface of the STI regions 308. As shown in FIG. 3E, the sidewalls 312 of fins 310 may extend at an angle with respect to a planar upper surface of substrate 300 to define undercut regions 314.

Once the fins 310 have been patterned, a gate dielectric layer 316 may be blanket formed over a top surface 318 of fins 310 as well as over STI regions 308. As described above, the gate dielectric layer may include oxides, nitrides, oxynitrides, high-k dielectrics including, but not limited to, $Ta_2O_5$, $Al_2O_3$, HfO, $SiTiO_3$, HfSiO, HfSiON, ZrSiON, and combinations thereof. A polysilicon layer forming a gate electrode 320 is formed over gate dielectric layer 316 and then covered by a hard mask 322. The hard mask may be formed of a nitride or an oxynitride by low-pressure chemical vapor deposition (LVCVD) or by plasma-enhanced chemical vapor deposition (PECVD). The gate dielectric, electrode, and hard mask layers 316, 320, 322 are patterned to provide the FinFET gate 324 as shown in FIG. 3F, which is a cross sectional view of the FinFET gate 324.

As shown in FIG. 3G, the sidewalls 326 of gate 324 are covered by sidewall spacers 328, which may be a nitride insulator. An insulating layer 330 is deposited over the sidewalls 326, 312 of the patterned FinFET gate 324 and fins 310 as shown in FIG. 3H. Insulating layer 330 may be an oxide, low-k silicon carbide (SiC), or carbon-doped silicon oxide deposited by a chemical vapor deposition (CVD) process as will be understood by one skilled in the art. Other low-k dielectric materials may also be used as for insulating layer 330.

A nitride layer 332 may be formed over the first insulating layer 330 as shown in FIG. 3I to provide an oxygen sealing layer. However, nitride layer 332 may be removed between fins 310 to reduce the parasitic capacitance using a wet etch process including phosphoric acid to provide the resultant structure shown in FIG. 3J while remaining on the side surfaces of gate 324. In some embodiments, the steps of depositing and removing nitride layer 332 may be skipped.

Figure 3K:
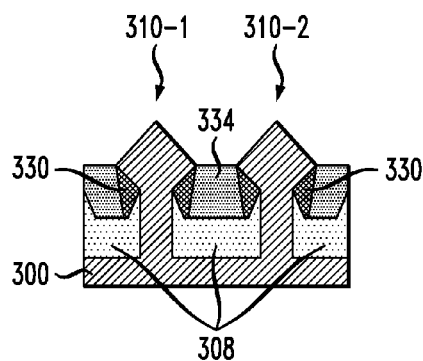

A second insulating layer 334 may then be deposited over the fins and STI regions 308 through a flowable CVD process. In some embodiments, the second insulating layer 334 is the same material as the first insulating layer 330. The second insulating layer 334 may be etched as shown in FIG. 3K to provide the desired height of the insulating layer(s) 330, 334. In some embodiments, the insulating layer(s) 330, 334 are etched until they have a height of approximately 25-85 percent of the height of the fins 310 as measured from the top of the STI regions 308. In some embodiments, the insulating layer(s) 330, 334 are etched until they have a height of approximately 50-75 percent of the height of the fins 310 as measured from the top of the STI regions 308. Accordingly, if the fins 310 extend to a height of approximately 50 nm as measured from a top surface of STI regions 308, then the insulating layer(s) 330, 334 may be etched until they have a height of approximately 30 nm as measured from a top surface of the STI regions 308.

Figure 3L:
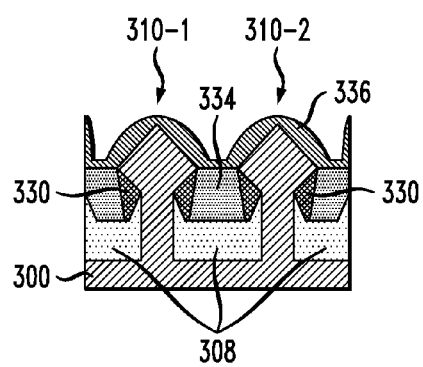
Figure 3M:
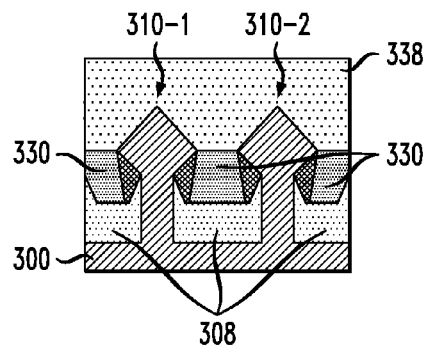

A contact edge stop layer (CESL) 336 may be formed over the fins 310 as shown in FIG. 3L. CESL 336 may provide a tensile strength in the channel region if the FinFET is an NMOS device, or CESL 336 may provide a compressive stress in the channel region if the FinFET is a PMOS device as will be understood by one skilled in the art. CESL 336 may be removed from an area over fins 310 where an interconnect is to be formed. A conductive layer 338 is formed over fins 310 where CESL 336 has been removed to provide an interconnect between fins 310-1, 310-2 as shown in FIG. 3M.

The process described above advantageously yields a FinFET having a gate region that extends above a semiconductor substrate and in a first longitudinal direction. A first fin having a first sidewall extends in a second longitudinal direction above the semiconductor substrate such that the first fin intersects the gate region, and a second fin having a second sidewall extends in the second direction above the semiconductor substrate such that the second fin intersects the gate region. A shallow trench isolation (STI) region is formed in the semiconductor substrate between the first and second sidewalls of the first and second fins, and a conductive layer is disposed over the STI region and over top surfaces of the first and second fins. A first insulating layer is disposed between an upper surface of the STI region and a lower surface of the conductive layer to separate the STI region from the conductive layer. The inclusion of the first insulating layer over the upper surface of the STI regions and below the lower surfaces of the conductive interconnect later between adjacent fins provides an electrically insulting barrier between the conductive interconnect layer and the STI region, which advantageously reduces the parasitic capacitance and increases the speed of the FinFET.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device, comprising: a gate region disposed above a semiconductor substrate and extending in a first longitudinal direction;
   a first fin disposed above the semiconductor substrate and extending in a second longitudinal direction such that the first fin intersects the gate region, the first fin having a first sidewall defining a first undercut;
   a second fin disposed above the semiconductor substrate and extending in the second longitudinal direction such that the second fin intersects the gate region, the second fin laterally spaced from the first fin and including a second sidewall and defining a second undercut;
   a first shallow trench isolation (STI) region formed in the semiconductor substrate between the first and second fins;
   a first insulating layer comprising a low-k dielectric disposed between the first and second fins and over an upper surface of the first STI region and below the lowest bottom surface of the conductive layer;
   a second insulating material disposed within the first and second undercut and in contact with the first insulating layer over the STI region,
   wherein the heights of the first and second insulating layers are same; and
   a conductive contact layer disposed over an upper surface of the first insulating layer and on top surfaces of the first and second fins to provide a fin interconnect,
   wherein the second insulating layer extends from the first insulating material disposed in the first undercut across the STI region to the first insulating material disposed in the second undercut and electrically insulates the conductive layer from the STI region.

2. The semiconductor device of claim 1, further comprising:
   a third fin disposed above the semiconductor substrate and extending in the second longitudinal direction such that the third fin intersects the gate region, the third fin having a third sidewall laterally spaced from a fourth sidewall of the first fin;
   a second STI region formed in the semiconductor substrate between the first and third fins; and
   a second insulating layer including the low-k dielectric disposed over and contacting an upper surface of the second STI region and below a lower surface of the conductive layer, the second insulating region extending from the third sidewall to the fourth sidewall.

3. The semiconductor device of claim 2, wherein the third and fourth sidewalls respectively define third and fourth undercuts, the second insulating material disposed within the third and fourth undercuts, and the second insulating layer extends from the second insulating material in the third undercut across the second STI region to the second insulating material in the fourth undercut.

4. The semiconductor device of claim 2, wherein the first and second insulating layers are one of an oxide, silicon carbide (SiC), carbon-doped silicon oxide, or fluorine-doped silicon oxide.

5. The semiconductor device of claim 2, wherein the first and second insulating layers have heights that are approximately 50-75 percent of a height of one of the first, second, or third fins.

6. The semiconductor device of claim 1, wherein the first insulating layer has a height that is approximately 50-75 percent of a height of the first and second fins as measured from an upper surface of the first STI region.

7. The semiconductor device of claim 6, wherein the first insulating layer is one of an oxide, silicon carbide, carbon-doped silicon oxide, or fluorine-doped silicon oxide.

* * * * *